United States Patent [19]

Liu

[11] Patent Number: 6,043,652
[45] Date of Patent: Mar. 28, 2000

[54] ALTERNATIVE RECONSTRUCTION METHOD FOR NON-EQUIDISTANT K-SPACE DATA

[75] Inventor: Haiying Liu, Minneapolis, Minn.

[73] Assignee: Picker International, Inc., Highland Heights, Ohio

[21] Appl. No.: 08/840,964

[22] Filed: Apr. 17, 1997

[51] Int. Cl.[7] .................................................. G01V 3/00
[52] U.S. Cl. ...................... 324/309; 324/309; 324/307; 600/410
[58] Field of Search .................................. 324/309, 307, 324/306; 600/410

[56] References Cited

U.S. PATENT DOCUMENTS

| | | |
|---|---|---|
| 4,165,479 | 8/1979 | Mansfield . |
| 4,509,015 | 4/1985 | Ordidge et al. . |
| 4,591,789 | 5/1986 | Glover et al. . |
| 4,678,996 | 7/1987 | Haacke et al. . |
| 4,701,706 | 10/1987 | Haacke . |
| 4,716,368 | 12/1987 | Haacke . |
| 4,841,247 | 6/1989 | Itagaki . |
| 4,982,162 | 1/1991 | Zakhor et al. . |
| 5,073,752 | 12/1991 | DeMeester et al. . |
| 5,087,880 | 2/1992 | Bruder et al. .......................... 324/309 |
| 5,352,981 | 10/1994 | Machida ................................ 324/309 |

FOREIGN PATENT DOCUMENTS 0 127 480 A2 5/1984 European Pat. Off. .

OTHER PUBLICATIONS

Jackson, et al., IEEE Trans. Med. Imaging 10,473 (1991).
Chen, Dao–Qi et al. "Reconstruction from NMR Data Acquired with Imaging Gradients Having Arbitrary Time Dependence," *Transactions on Medical Imaging*, vol. M1–5, No. 3, Sep. 1986.

Zeng, Gengsheng et al. "An SVD Study of Truncated Transmission Data in SPECT," *IEEE Transactions on Nuclear Science*, vol. 44, No. 1, Feb. 1997.

Proceedings of the International Society for Magnetic Resonance in Medicine, Fifth Scientific Meeting and Exhibition, Vancouver, B.C., Canada, Apr. 12–18, 1997.

*Primary Examiner*—Christine Oda
*Assistant Examiner*—Brij B. Shrivastav
*Attorney, Agent, or Firm*—Fay, Sharpe, Fagan, Minnich & McKee, LLP

[57] ABSTRACT

An alegebraic reconstruction matrix generator (90) generates an algebraic reconstruction matrix P. A gradient trajectory memory (94) contains elements $k_n$ which describe the k-space trajectory of a time-varying read gradient wave form. An A-matrix generator (96) generates a coefficient matrix A from the elements $k_n$. A D-matrix generator (100) generates a diagonal matrix D having elements $d_n$. Using the elements of matrices A and D, an H-matrix generator creates a matrix H. An inverter (110) inverts the matrix to obtain $H^{-1}$. A transposer (112) transposes matrix A to obtain $A^T$. A multiplication processor (114) combines $H^{-1}$, $A^T$, and D to obtain the algebraic reconstruction matrix P. A multiplication processor (122) then combines the matrix P and an array of image data lines b to generate an image matrix array X which is stored in an image memory (124). A one-dimensional column Fourier transform processor and associated memory (125) transforms and stores the image matrix array. A video processor (126) converts the image matrix array into an appropriate format for display on a video monitor (130). The image data sampling can be performed at previously unused portions of a read gradient wave form, thus reducing image acquisition time.

19 Claims, 7 Drawing Sheets

ALTERNATIVE RECONSTRUCTION METHOD FOR NON-EQUIDISTANT K-SPACE DATA

BACKGROUND OF THE INVENTION

The present invention relates to the art of medical diagnostic imaging. It finds particular application in conjunction with magnetic resonance imaging (MRI) and will be described with particular reference thereto. It is to be appreciated, however, that the invention will also find application in other imaging applications in which data is transformed between frequency and time or spatial domains.

One of the pursuits in MRI is increased imaging speed while maintaining or only minimally degrading the spatial resolution of a resultant image. In this spirit, fast imaging sequence such as echo-planar imaging (EPI) interleaved EPI, fast spin echo (FSE) as well as other imaging sequences are employed. In using such fast sequences, MRI systems are pushed to and beyond their hardware limits. Thus, to achieve increased imaging speed, imaging sequences are constantly being optimized. Along with this optimization, the process of reconstructing data obtained by such imaging sequences must be optimized.

Heretofore, magnetic resonance imaging subjects have been positioned in a temporally constant magnetic field such that selected dipoles preferentially align with the magnetic field. A radio frequency pulse is applied to cause the preferentially aligned dipoles to resonate and emit magnetic resonance signals of a characteristic resonance radio frequency. The radio frequency magnetic resonance signals from the resonating dipoles are read out for reconstruction into an image representation.

In a two-dimensional Fourier transform imaging technique, a read gradient is applied during the read out of the echo for frequency encoding along a read axis and a phase-encode gradient is pulsed to step phase-encoding along a phase-encode axis between echoes. In this manner, each echo generates a data line in k-space. The relative phase-encoding of the data lines controls their relative position in k-space. Conventionally, the data line with zero phase-encoding extends across the center of k-space. Data lines with a phase-encoding gradient stepped in progressively positive steps are generally depicted as being above the center line of k-space; and, data lines with progressively negative phase-encoding steps are depicted as being below the center line of k-space. In this manner, a matrix, such as a 256×256 or a 512×512, etc., matrix of data values in k-space is generated. Fourier transformation of these values generates a conventional magnetic resonance image.

To strengthen the received magnetic resonance signals, the initial signal is commonly refocused into an echo. This may be done by reversing the polarity of a magnetic field gradient to induce a field or gradient echo. Analogously, the radio frequency excitation pulse may be followed with a 180° pulse to refocus the signal as a spin echo. Moreover, by repeating the reversing of the magnetic field gradient, a series of gradient echoes can be generated following each radio frequency excitation pulse. Analogously, a series of spin echoes can be generated following each radio frequency excitation pulse by repeating the 180° radio frequency refocusing pulse. As yet another option, a single radio frequency excitation pulse can be followed by a mixture of spin and gradient echoes. See, for example U.S. Pat. No. 4,833,408 of Holland, et al.

In a single shot echo planar imaging (EPI) sequence, a single radio frequency excitation pulse or shot of arbitrary tip angle can be followed by a sufficient number of gradient reversals to generate an entire set of data lines. The magnetic resonance data from the object is collected during a series of echoes with an oscillatory read gradient that encodes the image object in the direction of the field gradient. See, e.g., P. Mansfield, J. Phys. Chemistry, Vol. 10, pp. L55–L58 (1977). In addition, a series of phase-encoding gradient pulses orthogonal to the read gradient direction are applied before each echo to step the data lines through k-space. The image of the object is preferably obtained with two one-dimensional inverse Fourier transforms of the echo data. This single shot EPI technique offers an ultra fast imaging technique for dynamic imaging in a sub-second time scale.

Multi-shot EPI techniques offer improved image quality over single-shot EPI techniques. In multi-shot EPI imaging, phase-frequency space or k-space is divided into a plurality of segments, e.g., 3 to 16 segments. After resonance excitation, the read gradient is oscillated to generate a train of echoes, hence data lines, in each of the segments of k-space. After another excitation, a different one of the data lines in each segment is generated. This process is repeated until k-space is filled in this interleaved fashion.

The one-dimensional inverse Fourier transform most often used to reconstruct the data obtained during an imaging sequence is the "fast Fourier transform," also known as the Cooley-Tukey algorithm. Although magnetic resonance literature often refers to a "Fourier transform", those skilled in the art understand that a fast inverse Fourier transform is being used. The universal use of the fast Fourier transform is evidenced by image sizes that are integer powers of two, such as 512×512, 256×256, etc. The use of square image matrices is dictated by the integer power of 2 requirements of the fast Fourier transform algorithm. This transform performs a Fourier transform operation on an N by N matrix with only $N\log_2 N$ mathematical operations. The fast Fourier transform algorithms are limited because N was required to be an integer power of an integer known as the Radix value, most commonly 2. The dramatic increase in speed was considered more than worth the limitation of the length of the data lines. Note that for a data line with 512 samples (N=512), the discrete Fourier transform required over 260,000 mathematical operations; whereas, the fast Fourier transform only requires about 4,600. Because computing time is roughly proportional to the number of mathematical operations, the discrete Fourier transform required about 56 times as long as a fast Fourier transform to process a 512 sample line. Due to the exponent in this relationship, larger data lines achieved an even more dramatic time savings. The fast Fourier transform reduced the computing time sufficiently that fast Fourier transforms became a standard computer subroutine.

Current MRI systems include hardware constraints such as time-varying gradient wave forms, non-linear magnetic gradients and rate of data sampling. Time-varying gradient wave forms or non-linear gradients can cause non-equidistant k-space data. For example, the "rise time" of a magnetic gradient pulse generator produces gradient pulses that are trapezoidally shaped rather than rectangularly shaped. In other words, the gradient pulses have "ramp up" and "ramp down" at their leading and trailing edges. Thus, the leading and trailing edges of the gradient pulses change with respect to time. Typically, data sampled during these ramped edges are also non-equidistant in k-space.

In other applications, time varying gradient pulses, such as sinusoidal gradient profiles, are intended. When data sampling during such time-varying gradient profiles, non-equidistant k-space data is obtained. This non-equidistant k-space data must be corrected before Fourier-transformation.

To reconstruct an image from non-equidistant k-space data, the data is first "gridded" to generate a set of uniformly spaced k-space data. Subsequently, the data is inverse fourier transformed to generate an image representation or image matrix.

In reconstructing an image from EPI data obtained with a time varying read-out gradient, generally a well known "gridding" algorithm is used to map the resultant non-uniform k-space data to uniformly spaced data. See Jackson, et al., IEEE Trans. Med. Imaging 10,473(1991). The final image is then obtained by Fourier transforming the data.

One of the problems of this gridding method stems from the use of a kernel function for convolution in interpolating the non-equidistant k-space data to an equidistant data set. The kernel function introduces errors as well as blurring into the final image.

As an alternative gridding method for Fourier transform based image reconstruction, a least squares estimator matrix is used to directly convert non-equidistant k-space data through a matrix multiplication into a uniformly spaced image matrix. See U.S. Pat. No. 4,982,162 to Zakhor et. al.

To efficiently generate an image matrix from non-equidistant k-space data with minimal loss of spatial resolution, reconstruction methods other than inverse fourier transforms may be used. One such reconstruction method is the linear system solution or singular value decomposition (SVD) method.

The Zakhor method suffers in that weighing factors for different linear equations are not considered in the least squares error minimization. Further, the image matrix size is fixed by the number of data samples. Still further, the method is not flexible for other applications such as zero padding.

The present invention provides a new and improved apparatus and method for generating improved quality images from data sets or matrices of non-equidistant k-space data.

SUMMARY OF THE INVENTION

In accordance with one aspect of the present invention, a magnetic resonance imaging system includes a magnet for generating a temporally constant magnetic field through an examination region. A radio frequency pulse controller and transmitter both excites and inverts magnetic dipoles in the examination region, and gradient magnetic field coils and a gradient magnetic field controller generate at least phase and read magnetic field gradient pulses in orthogonal directions across the examination region such that radio frequency magnetic resonance signals are generated. A receiver receives and demodulates the radio frequency magnetic resonance signals to produce a series of data lines. An algebraic matrix reconstruction processor operates on the data lines with an algebraic reconstruction matrix to at least partially reconstruct an array of data lines into a reconstructed image representation. An image memory stores the reconstructed image representation.

In accordance with a more limited aspect of the present invention, the algebraic matrix reconstruction processor includes a matrix generator. The matrix generator generates a matrix of coefficients for use in transforming the series of data lines into the reconstructed image representation.

In accordance with another aspect of the present invention, magnetic resonance is excited in magnetic dipoles in an examination region, the magnetic dipoles being induced to form a plurality of radio frequency magnetic resonance signals. The signals are read out along a read axis in the presence of a time-varying read gradient to form a series of data lines for reconstruction into an output image representation. An algebraic reconstruction matrix is generated which is dependent on the k-space trajectory of the read gradient. Data lines are received. The series of data lines are operated on with the algebraic reconstruction matrix to at least partially form the output image representation.

In a more limited aspect of the invention, a matrix of coefficients A is generated which are representative of a k-space trajectory of the read gradient. The matrix is transposed. A matrix H is generated, the matrix H being a function of the k-space trajectory. The matrix H is inverted by single value decomposition. A diagonal matrix of real numbers is generated. The inverted matrix H, the transposed matrix A and the diagonal matrix are multiplied to generate the algebraic reconstruction matrix.

One advantage of the present invention is that it reduces data acquisition time. Image data sampling is performed at previously unused portions of a read gradient wave form.

Another advantage of the present invention is that it requires no interpolation in raw data.

A further advantage of the present invention is that it does not introduce error or blurring into the reconstructed image on account of a selected interpolation procedure.

Another advantage is that rectangular image matrices may be generated which more aptly cover the desired examination area.

A still further advantage is that no k-space sampling density correction is necessary.

Another advantage is that the present invention is as computationally efficient as a Fourier reconstruction.

Another advantage of the present invention is improved image quality.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1A:
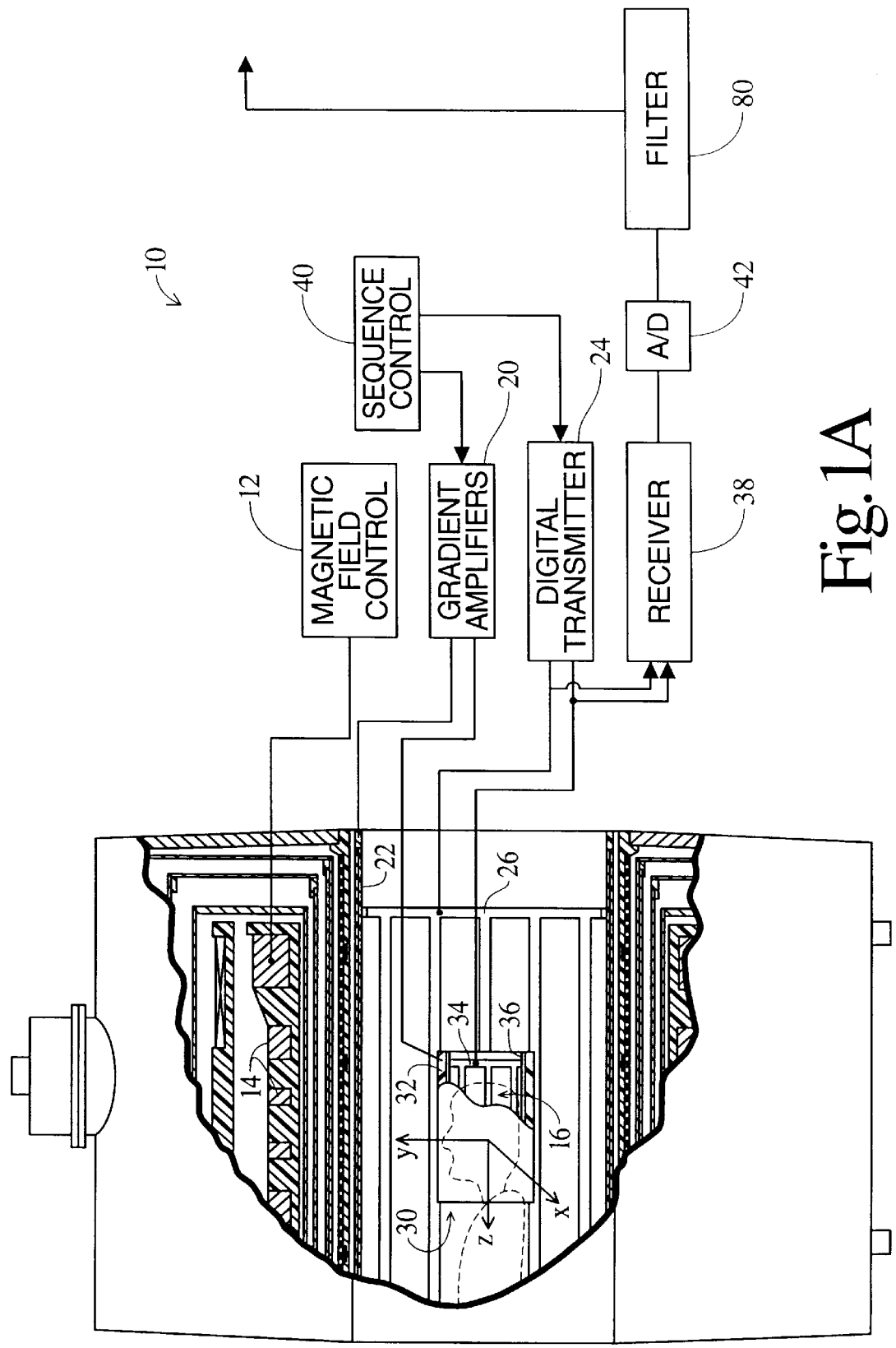
FIGS. 1A and 1B taken together are a diagrammatic illustration of a magnetic resonance imaging system in accordance with the present invention.
Figure 1B:
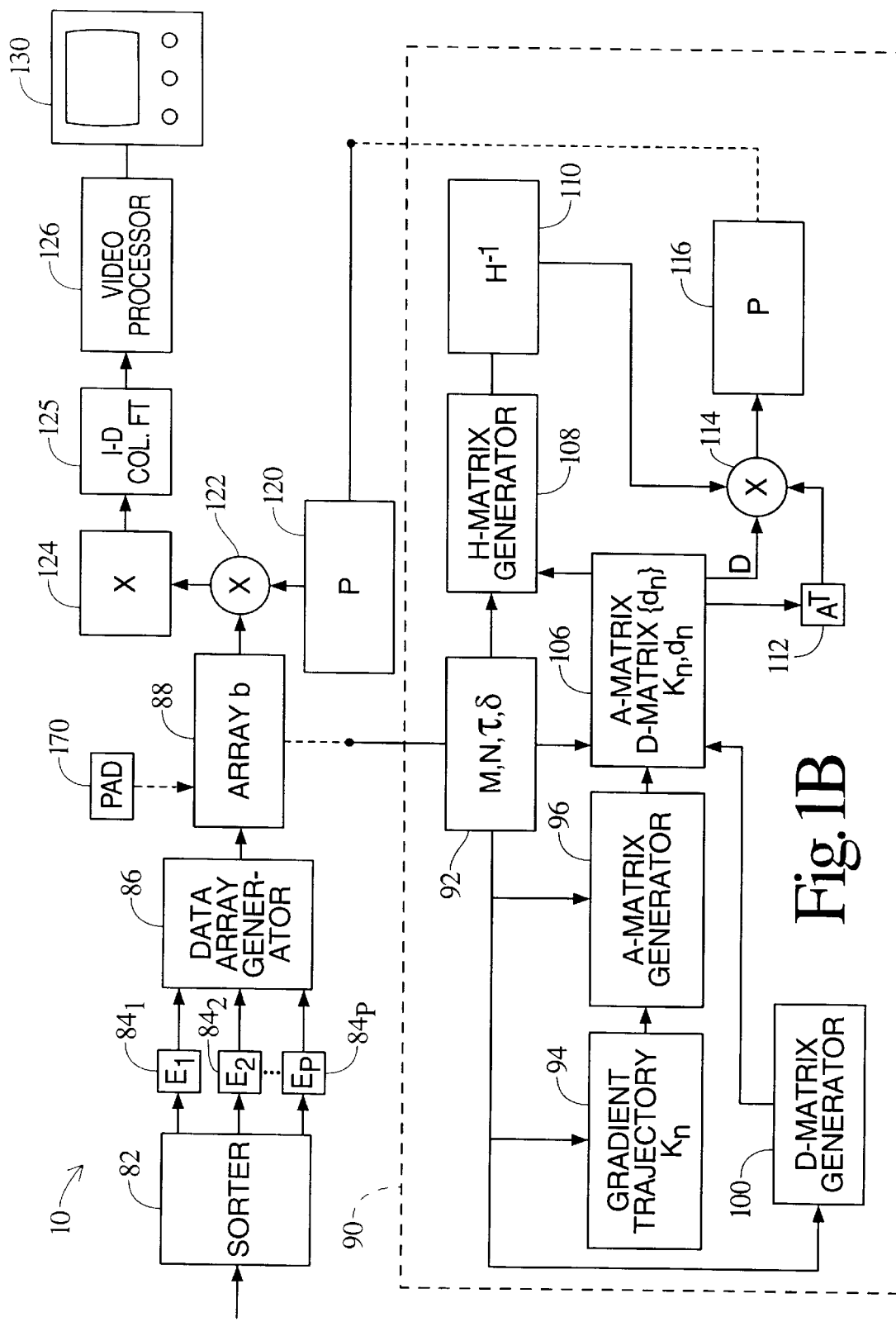

With reference to FIGS. 1A and 1B, a magnetic resonance imaging system 10 includes a main magnetic field control 12 which controls superconducting or resistive magnets 14 such that a substantially uniform, temporally constant magnetic field is created along a z-axis through an examination region 16. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, saturate spins, and the like in order to generate magnetic resonance imaging and spectroscopy sequences.

More specifically, gradient pulse amplifiers 20 apply current pulses to selected ones or pairs of whole body gradient coils 22 to create magnetic field gradients along x, y, and z-axes of the examination region. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate spins, excite resonance, invert magnetization, refocus resonance, or manipulate resonance in selected portions of the examination region. The resonance signals are picked up by the whole-body RF coil 26.

To generate images of limited regions of the subject, local coils are placed contiguous to the selected region. For example, an insertable head coil 30 is inserted surrounding a selected brain region at the isocenter of the bore. The insertable head coil 30 includes local gradient coils 32 which receive current pulses from the gradient amplifiers 20 to create magnetic field gradients along x, y, and z-axes in the examination region within the head coil 30. A local radio frequency coil 34 is used to excite magnetic resonance and receive magnetic resonance signals emanating from the patient's head. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole-body RF coil 26, the local RF coil 34, or other specialized RF coils and demodulated by a receiver 38.

A sequence control circuit 40 controls the gradient pulse amplifiers 20 and the transmitter 24 to generate any of a plurality of multiple echo sequences, including echo-planar imaging, echo-volume imaging, gradient and spin echo imaging, fast spin echo imaging, and the like. For the selected sequence, the receiver 38 receives a plurality of data lines in rapid succession following each RF excitation pulse. Preferably, the receiver 38 is a digital receiver or, as shown here, is accompanied by an analog-to-digital converter 42 for converting each data line into a digital format.

Figure 2:
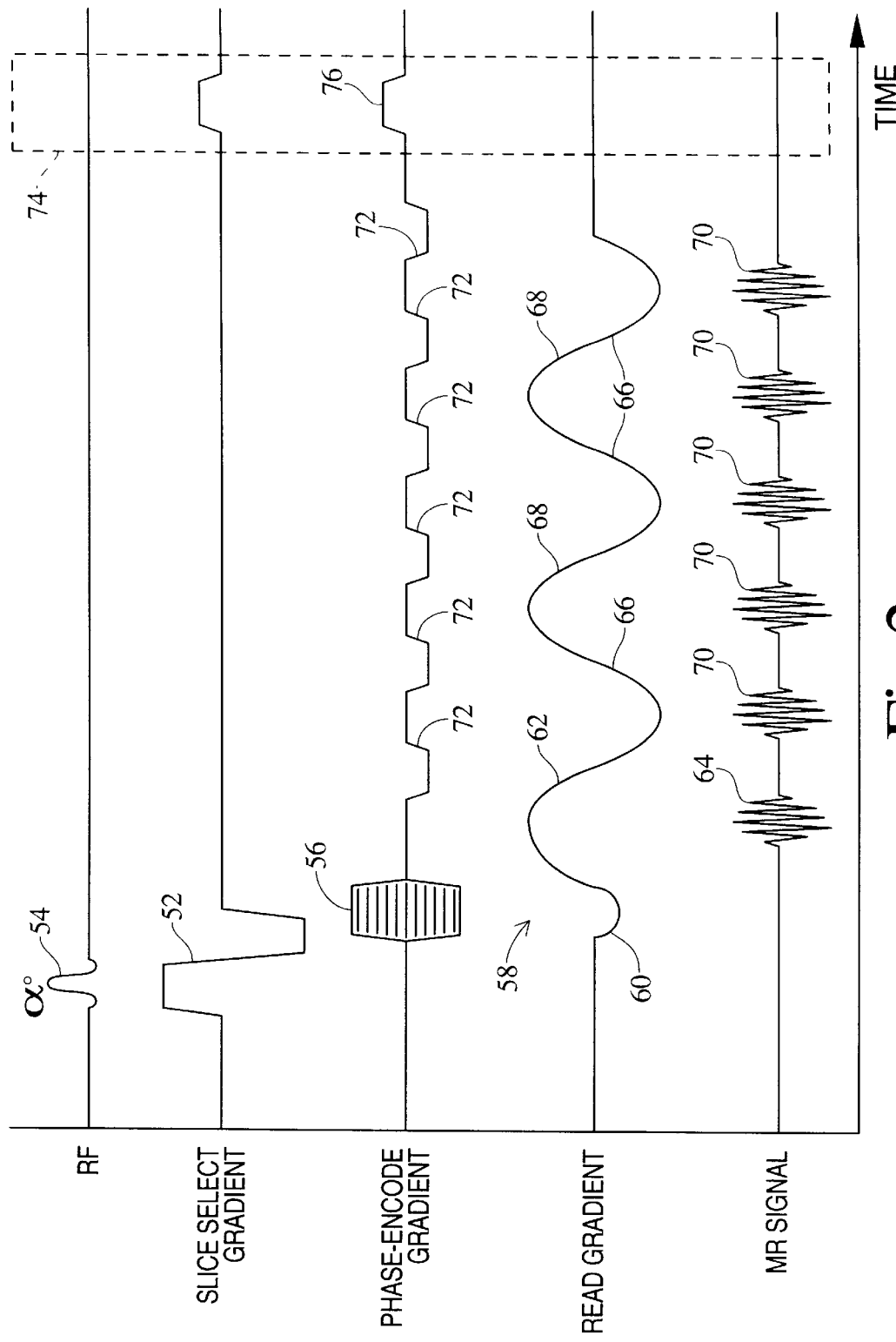
FIG. 2 is a diagrammatic illustration of single repeat time TR of a preferred multi-shot EPI imaging sequence.

With reference to FIG. 2, a single repetition of a multi-shot EPI sequence 50 commences with a slice select gradient pulse 52 and an excitation pulse 54 to tip magnetization in a selected slice by a selected angle. A phase-encode gradient 56 steps to an initial one of the p segments of k-space. A sinusoidal read gradient wave form or pulse profile 58 has a negative polarity read gradient portion 60 which causes dephasing along a read or frequency encode direction. Subsequently, a reverse polarity or positive read gradient portion 62 causes the magnetization to rephase into a gradient echo 64. Thereafter, negative polarity read gradient portions 66 and reverse polarity read gradient portions 68 produce additional echoes 70. The first gradient echo 64 is phase-encoded with the phase set by the phase-encode gradient 56. Phase encode gradient pulses or blips 72 are applied between each of p gradient echo to step the data lines from the subsequent gradient echoes among the p regions of k-space. Thus, the read gradient is reversed p times to generate p gradient echoes, one in each of the n segments of k-space. FIG. 2 illustrates an embodiment in which p=6.

After the last gradient echo is read, a dephasing routine 74 is applied. The dephasing routine may include a phase unwrap gradient 76 which is equal to the negative of the sum of the phase-encode gradient 56 and all of the phase-encode gradient pulses 72. The dephasing technique may also include a spoiler gradient 78 for randomizing any residual phase-encoding. This enables the next repetition to follow substantially immediately. Alternately, in multi-slice techniques, the phase-encoding within the slice may be allowed to dephase over time and the sequence repeated immediately to collect p data lines from one of the other imaged slices.

Referring again to FIGS. 1A and 1B, the digital data lines are passed through a low pass or smoothing filter 80, preferably a Blackman, Hanning, Hamming, or Gaussian filter. The filter centers around the projected center of the echo. The data lines are smoothed with the filter to reduce the noise level in later data processing.

The data lines are sorted 82 into echo data memories $84_1$, $84_2$, ..., $84_p$, corresponding to each of the p echoes of the sequence respectively, i.e., each of the p segments of k-space respectively. Using the data in the echo data memories, a data array generator 86 generates a one-dimensional raw data array b of size N. The array b is stored in an array memory 88.

The data array b is multiplied by a pre-computed algebraic reconstruction matrix P to generate an image matrix array X or reconstructed image representation. This pre-computation of the matrix P permits the algebraic image reconstruction technique to be as efficient as a fast Fourier transform reconstruction.

More particularly, an algebraic reconstruction matrix processor 90 generates the algebraic reconstruction matrix P. The reconstruction matrix processor includes memory 92 which contains the array b, the values for the size M of the desired image matrix array X, size N of the raw data array, the image matrix size M, and the span of the raw data τ.

The array b represents a set of linear equations:

$$b = AX + \epsilon \quad (1),$$

where X denotes an image matrix of size M. The value $\epsilon$ represents noise.

The symbol A represents a coefficient matrix given by:

$$A = \begin{pmatrix} \cdots & \cdots & \cdots \\ \cdots & A_{ij} & \cdots \\ \cdots & \cdots & \cdots \end{pmatrix}, \quad (2)$$

$$i = 1, \ldots, M; \, j = 1, \ldots, N$$

where the individual elements of matrix A are:

$$A_{nm} = e^{-i2\pi m k_n/\tau}, \quad (3)$$

$k_n$ : arbitary, $n = 1, \ldots, N$ $m = 1, \ldots, M$ where $\tau$ denotes a span of the raw data b in k-space.

For the sine-shaped read-out gradient wave form of the preferred embodiment, a gradient trajectory memory 94 within the reconstruction processor contains a corresponding k-space trajectory of the read-out gradient as:

$$k_n = \cos\left(\pi \frac{n}{N}\right) \frac{N}{\pi}, \quad (4)$$

$n = 1, \ldots, N.$

An A-matrix generator 96 generates a matrix A consisting of matrix elements:

$$A_{nm} = e^{-i2\pi m k_n/M} \quad (5)$$

$$M = N \frac{2}{\pi}$$

$n = 1, \ldots, N$ $m = 1, \ldots, M.$

A D-matrix generator 100 generates a diagonal matrix of dimension N×N. The diagonal elements of matrix D are chosen as a real array of numbers to optimize final image quality.

In the preferred embodiment, the choice is:

$$d_n = e^{+\frac{(n-N/2)^2}{\delta^2}}, \quad (6)$$

$n = 1, \ldots, N$ where $\delta$ is a parameter.

At that point, the values for the A-matrix, the D-matrix, $d_n$ and $k_n$ are stored in a memory 106.

An H-matrix generator 108 generates a matrix H for the particular k-space trajectory. The H-matrix for the particular k-space trajectory is represented as:

$$H_{s,t} = \sum_n d_n e^{i2\pi(s-t)k_n/\tau} \quad (7)$$

$$= \sum_n d_n e^{i2\pi(s-t)\frac{N}{\pi}\cos(\pi\frac{n}{N})/\tau}$$

$$= h_{(s-t)}$$

$n = 1, \ldots, N$ $s, t = 1, \ldots, M$ where $h_m$ is given by:

$$h_m = \sum_n d_n e^{i2\pi m \frac{N}{\pi}\cos(\pi\frac{n}{N})/\tau} \quad (8)$$

$n = 1, \ldots, N$ $m = 1, \ldots, M$

Using the one-dimensional vectors $h_m$, the H-matrix generator constructs the matrix H as:

$$h = \begin{pmatrix} h(1), h(2), h(3) & \ldots & \ldots \\ h(2), h(3), h(4) & \ldots & \ldots \\ \ldots & & \ldots & \ldots \\ h(M), h(M-1), h(M-2) & \ldots & \ldots \end{pmatrix} \quad (9)$$

The matrix H, which is independent of the measured data, is only a function of a specific k-space trajectory.

An H-matrix inverter 110 inverts the matrix H using the single value decomposition (SVD) method:

$$H = U\Lambda V^T \quad (10),$$

$$H^{-1} = V(\Lambda^T)^{-1} U^T \quad (11).$$

The symbol $\Lambda$ denotes a diagonal matrix of dimension M×M. Matrices U and V are two square matrices, both of dimension M×M.

An A-matrix transposing processor 112 transposes the A matrix to the form $A^T$. A multiplication processor 114 generates an algebraic reconstruction matrix P as:

$$P = H^{-1} A^T D \quad (12)$$

where matrix P denotes a M×N matrix. The matrix P is stored in a memory 116. Before examining a desired subject, the matrix P in the memory 116 is transferred to a P memory 120.

The data array b is combined with the pre-computed algebraic reconstruction matrix P to generate image matrix array X.

More particularly, the image data array b is stored in the memory 88. A multiplication circuit 122 multiplies the data array b from the memory 88 with the matrix P from the memory 120 as:

$$X = Pb \quad (13).$$

The resulting image matrix array X is stored in an image memory 124. A one-dimensional column Fourier transform processor and associated memory (125) transforms and stores the image matrix array. A video processor 126 converts the image matrix array into an appropriate format for display on a video monitor 130 or other human-readable output display device.

Figure 3:
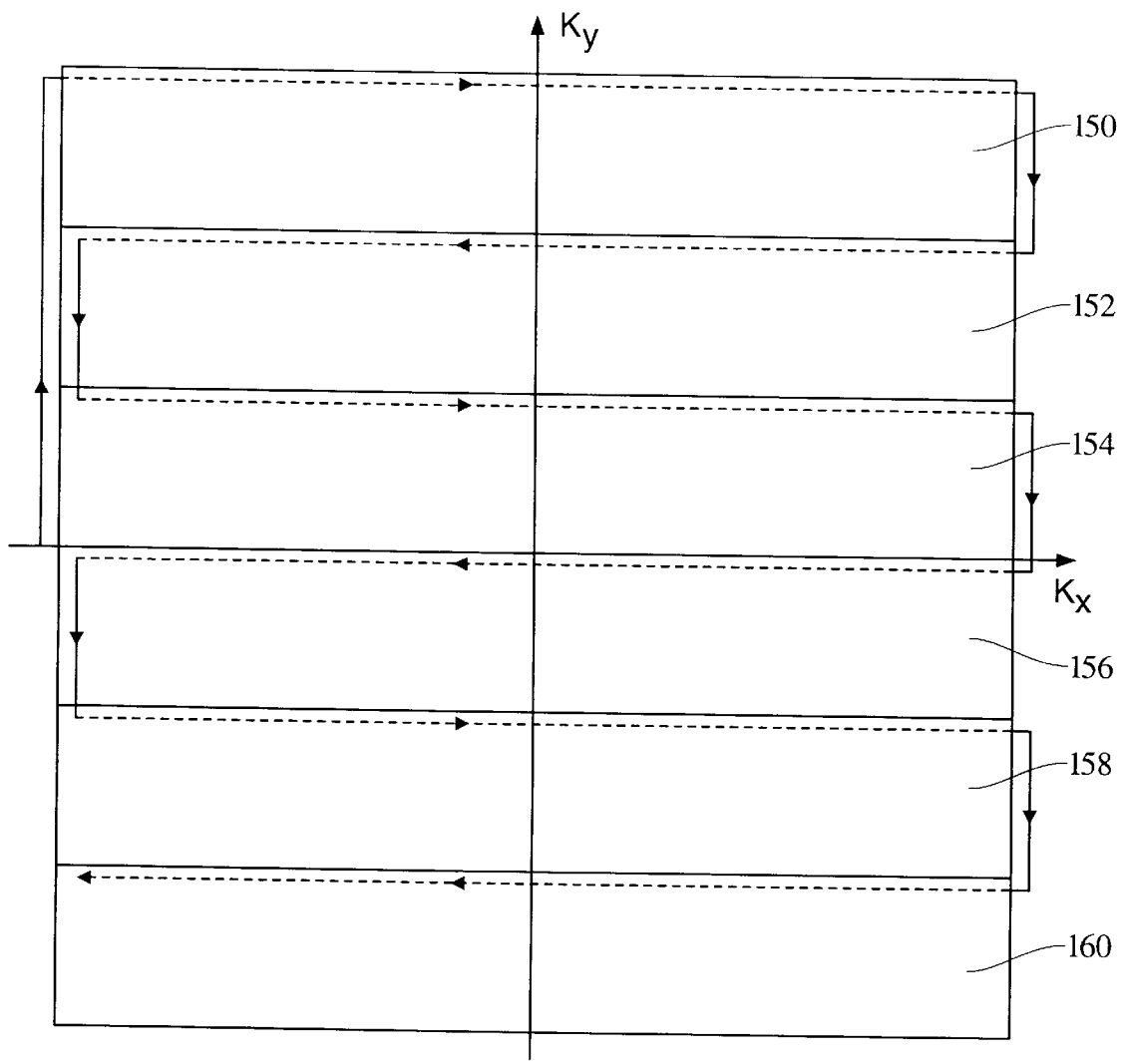
FIG. 3 is a diagrammatic illustration of a preferred trajectory through k-space.

The image data lines may be gathered by different trajectories through k-space. Referring to FIGS. 2 and 3, for example, the phase-encode gradient 56 is indexed to the phase encode step at the top of k-space, which is at the top of the first segment 150. Because the read gradient wave form for a data line varies in time, the data points of the data line will be non-equidistant. For the sinusoidal read gradient wave form of this particular traversal through k-space, each of the data lines is shown with closely spaced data points at the edges of k-space in the $k_x$ direction. The data points are gradually more widely spaced to one another as they near the vertical center of k-space, i.e., the $k_y$ axis. Each of the phase-encode blips 72 steps the phase-encoding to the top data line in the next lower segment 152 of k-space, then to the top data line in the next lower segment 154 and so on for the remaining segments 156, 158, and 160. On subsequent repetitions, the phase-encode gradient 56 sets the phase-encode step at progressively lower data lines within the first segment of k-space 150. Similarly, phase-encode blips 72 set the phase-encode steps at progressively lower data lines within each of the lower segments of k-space 152, 154, 156, 158, and 160. In this manner, all of the data lines in k-space are covered.

In an alternative embodiment, overlapping segments in k-space are collected and used for the image reconstruction. All the overlapping data is combined or merged for image formation.

In another embodiment of the invention, a k-space image is reconstructed by solving the linear equation directly with the SVD method as shown:

$$AX = b \quad (14)$$
$$A = U^T \Lambda V$$
$$A^{-1} = V(\Lambda^T)^{-1} U^T$$

The A matrix can be either over or under-determined. The SVD method automatically guarantees a minimum norm solution.

It will be appreciated by those skilled in the art that any imaging technique can be modeled as a linear system for use with the present invention. An appropriate matrix A for the set of linear equations is calibrated based on the given imaging technique. Image constraints are then incorporated into the image reconstruction.

Figure 4:
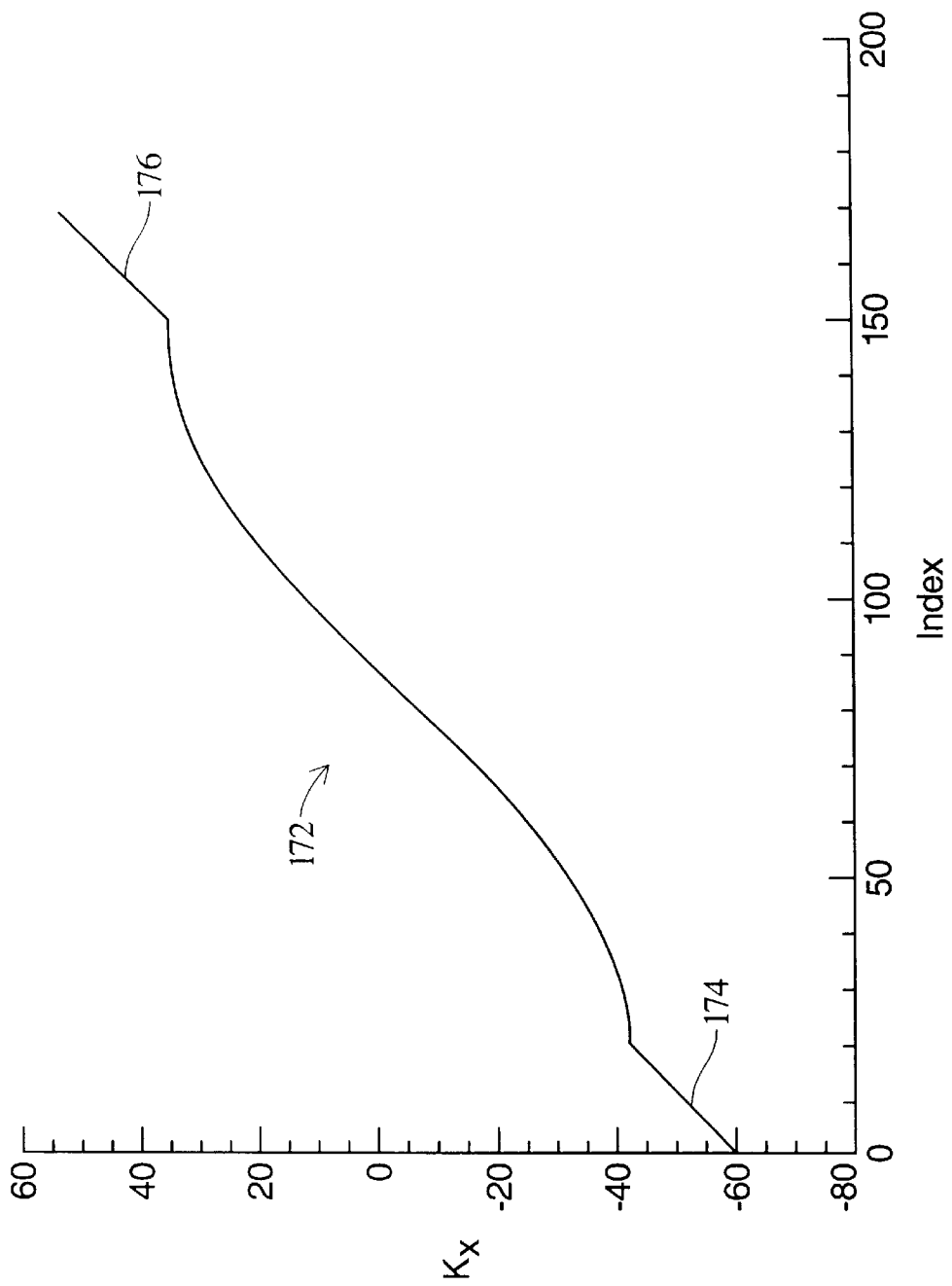
FIG. 4 is a diagrammatic illustration of a k-space trajectory having linear extensions with a maximum k-space step size.

Referring to FIGS. 1B and 4, in a further embodiment of the invention, the technique described is used with zero padding for k-space data interpolation. In this technique, a zero padding processor 170 symmetrically adds zeroes to both sides of the one-dimensional raw data array b to extend the length of the input raw data array. To match the length of b, the k-space trajectory as well as the matrix H is fictitiously extended. Being fictitious, the extended k-space trajectory can be arbitrary. Referring to FIG. 4, in this preferred embodiment, the k-space trajectory 172 is maximally linearly extended using the k-space trajectory extensions 174 and 176.

Figure 5:
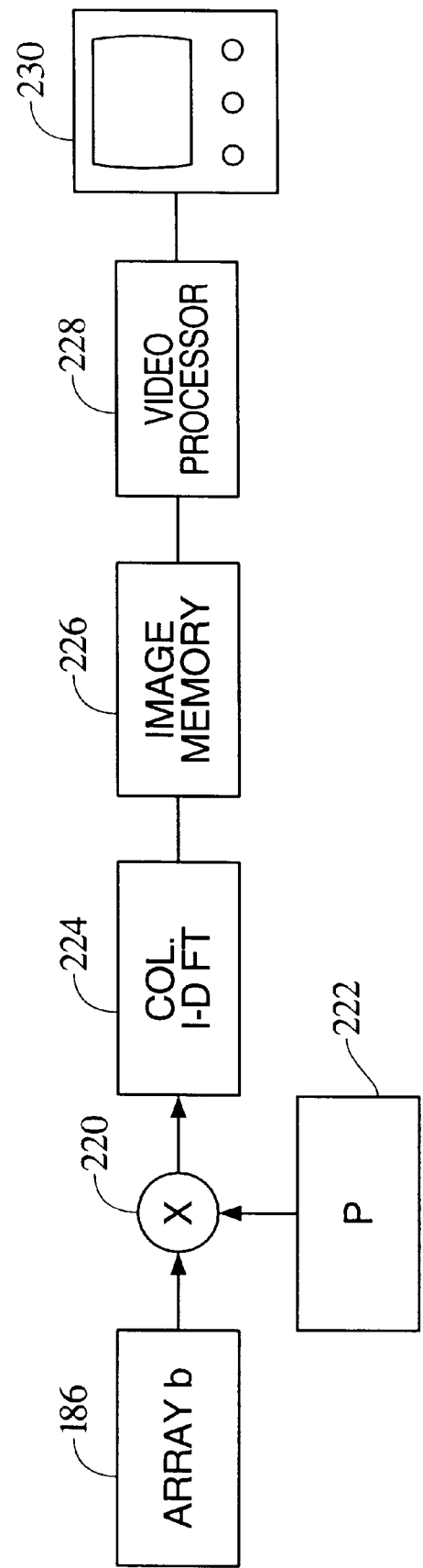
FIG. 5 is a diagrammatic illustration of a portion of an alternative embodiment of the present invention; and, FIG. 6 is a diagrammatic illustration of a portion of another embodiment of the present invention.

Referring to FIG. 5, in an alternate embodiment of the invention, the data lines b in a memory 186 have non-equidistant data points, analogous to FIG. 4. A multiplication processor 220 multiplies the data lines by a pre-computed algebraic reconstruction matrix P from a memory 222. The resulting data lines are Fourier transformed in the column direction by Fourier transform processor 224. The Fourier transformed data lines are stored in image memory 226. A video processor 228 converts the Fourier transformed data lines into an appropriate format for display on a video monitor 230 or other human-readable output display device.

Figure 6:
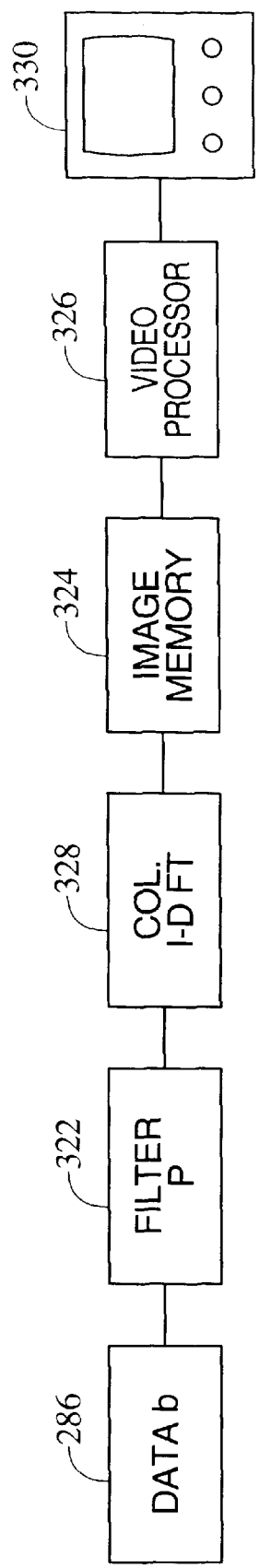

Referring to FIG. 6, in yet another embodiment of the invention, algebraic image reconstruction is combined with Fourier reconstruction to reconstruct EPI image data acquired with non-constant read gradient pulse profiles. It will be appreciated by those skilled in the art that other sequences having non-constant read gradient pulse profiles may be used. More specifically, the non-equidistant k-space data of a memory 286 is filtered line by line through an algebraic matrix filter 322 having algebraic matrix P. The matrix P is pre-determined based on the k-space trajectory of a read-out gradient wave form of the EPI sequence. A 1-dimensional column Fourier transform processor 328 transforms the data to produce an image which is stored in an image memory 324. A video processor 326 converts the Fourier transformed data lines into an appropriate format for display on a video monitor 330.

In this embodiment, only one Fourier transform is used in the image reconstruction. No smoothing filter is used in image reconstruction as required by typical EPI reconstruction using a traditional gridding method. As a result of this direct reconstruction, the algebraically reconstructed image is sharper spatially. In this embodiment, the size of the algebraic matrix A is N×M, where N is the number of data samples (typically about 200) per view or phase encoding step, and M (typically about 128) is the size of the image matrix in the read direction. The sizes of these matrices are selected for reasonably efficient computation using current computer hardware. Of course, larger sizes may be used where appropriate.

In another embodiment of the invention, the technique of the present invention is applied to other imaging sequences in which data sampling occurs during non-constant read gradients. For instance, data sampling can occur during "ramp up" and "ramp down" of the read gradient for all echoes and views. Such sequences which may employ data sampling during non-constant read gradients include spin echo (SE), field echo (FE), fast spin echo (FSE) and gradient spin echo (GSE). To reconstruct the resultant non-equidistant k-space data, the data is first passed through an algebraic reconstruction matrix filter, and then column Fourier transformed to form the final image. Because data sampling can occur during previously unused portions of a read gradient wave form, increased data sampling is achieved for a given sequence.

In another embodiment of the invention, phase correction is performed in the reconstruction of an EPI image. One such technique requires obtaining an extra set of calibration data. The calibration data is acquired using the same sequence as when acquiring imaging data, except that the phase encoding gradient is set to zero. Both calibration data and image data are passed through the same algebraic equation as described above. Then, the calibration data is normalized line by line. Next, each image data line is multiplied by a conjugate of the calibration data line corresponding to the same echo and slice indexes to produce an immediate 2D data matrix. Finally, the 2D data matrix is one-dimensionally Fourier transformed in the column direction.

In still a further embodiment of this invention, the technique of the present invention is applied to partial fourier image reconstruction techniques. In an iterative fashion, the image can be reconstructed with a phase constraint imposed.

In another embodiment of the invention, non-equidistant k-space data is corrected using gridding, algebraic image reconstruction techniques and Fourier transformation. A gridding algorithm is represented in a matrix form as:

$$(\xi^{eq})_M = (G)_{M \times N} (\xi)_N \quad (15).$$

The symbol G denotes a gridding matrix of size M×N. The symbol $(\xi)_N$ represents a complex 1 dimensional raw data array of size N. The symbol $(\xi)_M$ denotes data array of size M after gridding.

For a sinc interpolation in the raw data domain, the elements of the convoluting matrix G are:

$$G_{mn} = sinc\left[2\frac{\pi(m - k_n)}{\Delta k}\right] \quad (16)$$
$$n = 1, \ldots, N$$
$$m = 1, \ldots, M$$

The sinc function is defined as:

$$sinc(x) = \frac{\sin(x)}{x}. \quad (17)$$

The value $\Delta k=1$. The non-uniform k-space data sampling density is corrected before final fourier transformation. The raw data gridding procedure can be incorporated into this formalism as follows:

$$AX=b \quad (18)$$

Gridding is incorporated into the equation:

$$GAX=Gb \quad (19)$$

This new algebraic matrix equation is solved similarly as described above.

In an additional embodiment of the present invention, the algebraic image reconstruction technique is used for partial image reconstruction. A complex 1 dimensional raw data array $\xi$ of size N representing a set of partial k-space data is reconstructed to form a corresponding image matrix array X of size M.

This is performed by using the techniques described above to solve the algebraic equation:

$$\xi=WX+\epsilon \quad (20)$$

In order to describe the principles of the invention more clearly, the technique of algebraic image reconstruction can be explained by introducing a one-dimensional matrix b of over-determined linear equations. The matrix b represents a complex one-dimensional raw data array of size N.

$$b=AX+\epsilon \quad (21)$$

The symbol X denotes an image matrix of size M. The symbol $\epsilon$ represents noise. The matrix A is a coefficient matrix given by:

$$A = \begin{pmatrix} \cdots & \cdots & \cdots \\ \cdots & A_{ij} & \cdots \\ \cdots & \cdots & \cdots \end{pmatrix} \quad (22)$$

$$i = 1, \ldots, M; j = 1, \ldots, N.$$

The individual elements of matrix A are:

$$A_{nm} = e^{-i2\pi m k_n/\tau} \quad (23)$$

$k_n$ : arbitary, $n = 1, \ldots, N$ $m = 1, \ldots, M.$

The value $\tau$ is the span of the raw data b in k-space.

In a standard discrete Fourier transform (DFT) reconstruction, the number N is equal to M. Thus, the coefficient matrix A is a squared matrix. With such a linear equation set, the optimal solution is unique and exact.

However, for an over-determined system, there are a subset of linearly dependent equations among the above linear equations set b. Due to the non zero noise in the data, the solution will not be exact. In order to seek an optimal solution, a least square error scheme is used to invert the singular coefficient matrix equation (1). The least squared error J for x is obtained as:

$$J=\|b-\hat{A}\hat{x}\|^2$$

$$=(b-\hat{A}\hat{x})^+D(b-\hat{A}\hat{x}) \quad (24)$$

Superscript + denotes a complex conjugate and matrix transpose. The matrix D is a diagonal matrix of dimension of N×N. The diagonal elements of matrix D are chosen as a real array of numbers to optimize final image quality. In the preferred embodiment, the choice is:

$$d_n = e^{\pm \frac{(n-N/2)^2}{\delta^2}} \quad (25)$$

$$n = 1, \ldots, N,$$

where $\delta$ is a parameter.

The solution for x as a result of minimum condition of J is:

$$A^T DAX = A^T Db \quad (26)$$

The portion $A^T DA$ is first decomposed as follows:

$$A^T DA = U\Lambda V^T = H \quad (27)$$

The symbol $\pi$ denotes a diagonal matrix of dimension M×M. Matrices U and V are two square matrices of dimension M×M and M×M, respectively.

The matrix H is given by:

$$H_{s,t} = \sum_n A_{ns}^* D_{nn} A_{nt} \quad (28)$$

$$= \sum_n d_n e^{i2\pi(s-t)k_n/\tau}$$

$$n = 1, \ldots, N$$

$$s, t = 1, \ldots, M.$$

The matrix H element of index(s,t) is only a function of (s−t). This type of matrix is known as a Toeplitz matrix in signal processing which attributes certain efficiencies in computation and simplification. A vector $h_m$ is defined as:

$$h_m = \sum_n d_n e^{i2\pi m k_n/\tau} \quad (29)$$

$$n = 1, \ldots, N$$

$$m = 1, \ldots, M.$$

The matrix H can be constructed by a one dimensional h vector as shown below:

$$H = \begin{pmatrix} h(1), h(2), h(3) & \cdots & \cdots \\ h(2), h(3), h(4) & \cdots & \cdots \\ \cdots & & \cdots & \cdots \\ h(M), h(M-1), h(M-2) & \cdots & \cdots \end{pmatrix} \quad (30)$$

Then, using the single value decomposition (SVD) method to invert the matrix H, the solution to X of the linear system is:

$$X = H^{-1} A^T Db$$

$$H^{-1} = V(\Lambda^T)^{-1} U^T \quad (31)$$

Effectively, the reconstructed image matrix solution is given by:

$$X = Pb$$

$$P = H^{-1}A^{T}D \quad (32),$$

where the matrix P denotes an M×N matrix.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging system which includes a magnet which generates a temporally constant magnetic field through an examination region, a radio frequency pulse controller and transmitter which excite magnetic dipoles in the examination region, and gradient magnetic field coils and a gradient magnetic field controller which generate magnetic field gradient pulses across the examination region such that spatially encoded radio frequency magnetic resonance signals are generated, a receiver which receives and demodulates the radio frequency magnetic resonance signals to produce a series of data lines, and an image memory for storing a reconstructed image representation, the improvement comprising:

an algebraic reconstruction processor which operates on an array of data lines with an algebraic reconstruction matrix to at least partially reconstruct the data lines into the reconstructed image representation.

2. In the magnetic resonance imaging system as set forth in claim 1, a means for generating the algebraic reconstruction matrix including:

an A-matrix generator for generating a matrix of coefficients for use in transforming the series of data lines into the reconstructed image representation.

3. In the magnetic resonance imaging system as set forth in claim 2, a means for generating the algebraic reconstruction matrix further including:

a gradient trajectory memory for storing k-space trajectory data which represents pre-selected magnetic field gradient pulses, the k-space trajectory data being used to generate the matrix of coefficients.

4. In the magnetic resonance imaging system as set forth in claim 3, the algebraic reconstruction matrix generating means further including:

an H-matrix generator for generating a matrix H for use in transforming the series of data lines into the reconstructed image representation, the H matrix being a function of the k-space trajectory data.

5. In the magnetic resonance imaging system as set forth in claim 4, the algebraic reconstruction matrix generating means further including:

an H-matrix inverter for inverting matrix H by single value decomposition, the inverted matrix H being used in transforming the series of data lines into the reconstructed image representation.

6. In the magnetic resonance imaging system as set forth in claim 5, the algebraic reconstruction matrix generating means further including:

an A-matrix transposing processor for transposing the matrix A which is used in transforming the series of data lines into the reconstructed image representation.

7. In the magnetic resonance imaging system as set forth in claim 6, the algebraic reconstruction matrix generating means further including:

a multiplication processor which multiplies the inverted H matrix, the transposed matrix A, and a diagonal matrix to generate an algebraic reconstruction matrix which is multiplied by an array of data lines to form the reconstructed image representation.

8. In the magnetic resonance imaging system as set forth in claim 1, a means for generating the algebraic reconstruction matrix including:

a matrix memory for storing a matrix which is used to algebraicly reconstruct the series of data lines into the reconstructed image representation, the matrix being a function of k-space trajectory data.

9. In the magnetic resonance imaging system as set forth in claim 1, the algebraic reconstruction processor including:

a zero-padding processor for adding zeros to a raw data array of the series of data lines to generate a zero-padded raw data array, the zero-padded raw data array being used to generate the reconstructed image representation from the series of data lines.

10. In the magnetic resonance imaging system as set forth in claim 1, the algebraic reconstruction processor including:

an algebraic matrix filter for algebraically filtering the series of data lines in one direction, line by line; and, a one-dimensional inverse Fourier transform processor for transforming the filtered data lines in an orthogonal direction into the reconstructed image representation.

11. In a method of magnetic resonance imaging in which magnetic resonance is excited in magnetic dipoles in an examination region, the magnetic dipoles being induced to form a plurality of radio frequency magnetic resonance signals, the signals being read out along a read axis in the presence of a time-varying read gradient to form a series of data lines for reconstruction into an output image representation, the improvement comprising:

generating an algebraic reconstruction matrix dependent on a k-space trajectory of the read gradient;

receiving a series a data lines;

operating on the series of data lines with the algebraic reconstruction matrix to at least partially form the output image representation.

12. The method of claim 11 wherein the step of generating includes:

generating a matrix A of coefficients representative of the k-space trajectory of the read gradient;

transposing the matrix A;

generating a matrix H, the matrix H being a function of the k-space trajectory;

inverting the matrix H by single value decomposition;

generating a diagonal matrix of real numbers;

multiplying the inverse of matrix H, the transpose of matrix A and the diagonal matrix to generate algebraic reconstruction matrix.

13. The method of claim 11 further comprising:

adding zeros to the ends of the data lines prior to operation on the series of data lines with the algebraic reconstruction matrix.

14. The method of claim 11 wherein the step of operating includes:

filtering the series of data lines, line by line through an algebraic matrix filter;

one-dimensionally column inverse Fourier transforming the filtered data lines into the output image representation.

15. A method of magnetic resonance imaging in which magnetic resonance is excited in magnetic dipoles which are induced to form a plurality of radio frequency magnetic resonance signals, the signals being read out along a read axis in the presence of a read gradient to form a series of data lines for reconstruction into an output image representation X, the method comprising:

reconstructing the series of data lines represented by an array b of size N into the output image representation X of size M by solving for X using the equation:

$$X = H^{-1}A^T Db$$

where a matrix A consists of matrix elements:

$$A_{nm} = e^{-i2\pi mk_n/M}$$
$$M = N\frac{2}{\pi}$$
$$n = 1, \ldots, N$$
$$m = 1, \ldots, M$$

where a matrix D consists of diagonal elements $d^n$, which are real numbers, where a matrix H representing a k-space trajectory consists of elements $h_m$ given by:

$$h_m = \sum_n d_n e^{i2\pi m \frac{N}{\pi}\cos(\pi \frac{n}{N})/\tau}$$
$$n = 1, \ldots, N$$
$$m = 1, \ldots, M$$

is formed as:

$$H = \begin{pmatrix} h(1), h(2), h(3) & \ldots & \ldots \\ h(2), h(3), h(4) & \ldots & \ldots \\ \ldots & & \ldots & \ldots \\ h(M), h(M-1), h(M-2) & \ldots & \ldots \end{pmatrix}$$

where $H^{-1}$ is formed by single value decomposition represented by:

$$H = U\Lambda V^T$$
$$H^{-1} = V(\Lambda^T)^{-1}U^T$$

where $\Lambda$ denotes a diagonal matrix of dimension M×M, matrices U and V are two square matrices, both of dimension M×M.

16. A magnetic resonance imaging method comprising:
generating an array of non-equidistant k-space data from an examination region using time-varying magnetic read gradient wave forms;
operating on the array of non-equidistant k-space data with the algebraic reconstruction matrix which is dependent on the k-space trajectory of the time-varying magnetic read gradient wave forms to generate an image representation.

17. The method of claim 16 further including generating the algebraic reconstruction matrix including:
generating a matrix in accordance with the k-space trajectory.

18. The method of claim 17 further including:
zero-padding the data lines to form the array of non-equidistant k-space data which artificially extends the trajectory through k-space.

19. The method of claim 16 wherein the operating step includes:
filtering the data, line by line, through the algebraic reconstruction matrix; and,
one-dimensionally inverse Fourier transforming the filtered data to generate the image representation.

* * * * *